United States Patent [19]

Sugita et al.

[11] Patent Number: 4,710,731
[45] Date of Patent: Dec. 1, 1987

[54] PLANAR TYPE THICKNESS SHEAR MODE QUARTZ OSCILLATOR

[75] Inventors: Mitsuyuki Sugita; Isamu Hoshino, both of Tokyo, Japan

[73] Assignee: Seikosha Co., Ltd., Tokyo, Japan

[21] Appl. No.: 885,931

[22] Filed: Jul. 15, 1986

[30] Foreign Application Priority Data

Jul. 15, 1985 [JP] Japan ................. 60-155734

[51] Int. Cl.⁴ ............................................. H03B 5/32
[52] U.S. Cl. ................................... 331/158; 310/369
[58] Field of Search ............ 331/116 R, 116 FE, 158; 310/367, 369

[56] References Cited

U.S. PATENT DOCUMENTS 4,112,323  9/1978  Kawashima .............. 310/369 X

FOREIGN PATENT DOCUMENTS 56-75718  6/1981  Japan ................. 310/369
58-165412  9/1983  Japan ................. 310/369

*Primary Examiner*—Siegfried H. Grimm
*Attorney, Agent, or Firm*—Bruce L. Adams; Van C. Wilks

[57] ABSTRACT

A planar type thickness shear mode quartz resonator which can be operated by an oscillation circuit free of any coils or condensers in the tuning circuit and in which the ratio between the diameter and the thickness of the resonator is so designed as to yield stable oscillation in the third overtone. The difference between the negative resistance of the oscillation circuit and the crystal impedance of the quartz resonator is greater in the third overtone than the difference in other oscillation modes.

10 Claims, 9 Drawing Figures

PLANAR TYPE THICKNESS SHEAR MODE QUARTZ OSCILLATOR

BACKGROUND OF THE INVENTION

This invention relates to planar type thickness shear mode quartz resonators or vibrators or oscillators such as AT-cut quartz resonators and more particularly to quartz resonators designed to oscillate in the third overtone.

Conventionally, in planar type quartz resonators or oscillators among thickness shear mode quartz oscillators, usually the proportions of diameters (D) and thicknesses (T) are so designed to oscillate the oscillators in fundamental tones. Commonly the proportion is within the range from $D/T=50$ to $D/T=100$. The reason is as follows. Oscillation of a quartz oscillator is determined by the difference between the negative resistance of an oscillation circuit and the crystal impedance of the quartz oscillator, and the quartz oscillator oscillates in an oscillation mode in which the difference is greatest. The negative resistance of an oscillation circuit tends to decrease in proportion as the frequency becomes high. In other words, the negative resistance decreases in proportion as the ratio $D/T$ increases. Whereas the impedance of a quartz oscillator shows a sharp decline curve with respect to the proportion $D/T$, and impedance in fundamental tone becomes lowest among impedances in all oscillation modes near or above $D/T=45$. The characteristic curve of negative resistance of an oscillation circuit varies according to the IC (integrated circuit) used in the oscillation circuit, and the impedance of a quartz oscillator changes with the diameter and other factors. The aforementioned relation, however, exists fundamentally and the proportion $D/T$ is usually designed within the range from 50 to 100 so as to get stable oscillation in fundamental tone. Some conventional planar type quartz oscillators are driven in third overtone, but in such case, oscillation circuits are provided with tuning circuits composed of coils (L) and condensers (C).

In the prior art, as described above, very thin quartz plates of $D/T=50\sim100$ are employed and such quartz oscillators are subjected to the influence of supporting means, and it has been difficult to realize high, stable oscillations due to the decrease in the quality factor (Q). Further, the thickness of the quartz oscillators is so thin that they are low in shock resistance and apt to break. Further, in an oscillation device which is provided with a tuning circuit with L (coils) and C (condensers) for getting third overtone, it is inevitable that the device must be large due to the tuning circuit, especially the coil (L), and the structure becomes complex with the increased number of parts.

The present invention provides a planar type thickness shear mode quartz oscillator to be operated by an oscillation circuit without a L, C (coils, condensers) tuning circuit in which the ratio between the diameter and the thickness of the oscillator is so designed as to perform stable oscillation in third overtone.

BRIEF DESCRIPTION OF THE DRAWINGS

The drawings show an embodiment of the present invention in which.

DETAILED DESCRIPTION OF THE INVENTION

Figure 2:
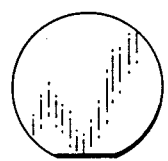
FIG. 2 is a plan view of a quartz resonator.
Figure 3:
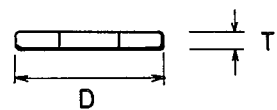
FIG. 3 is an elevational view of the quartz resonator of FIG. 2.
Figure 4:
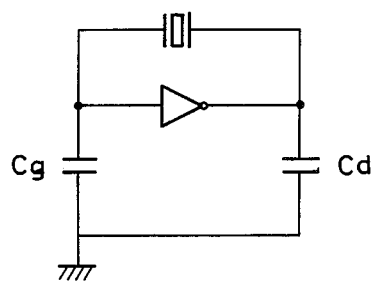
FIG. 4 is an oscillation circuit which is not provided with a L, C (coils, condensers) tuning circuit.
Figure 5:
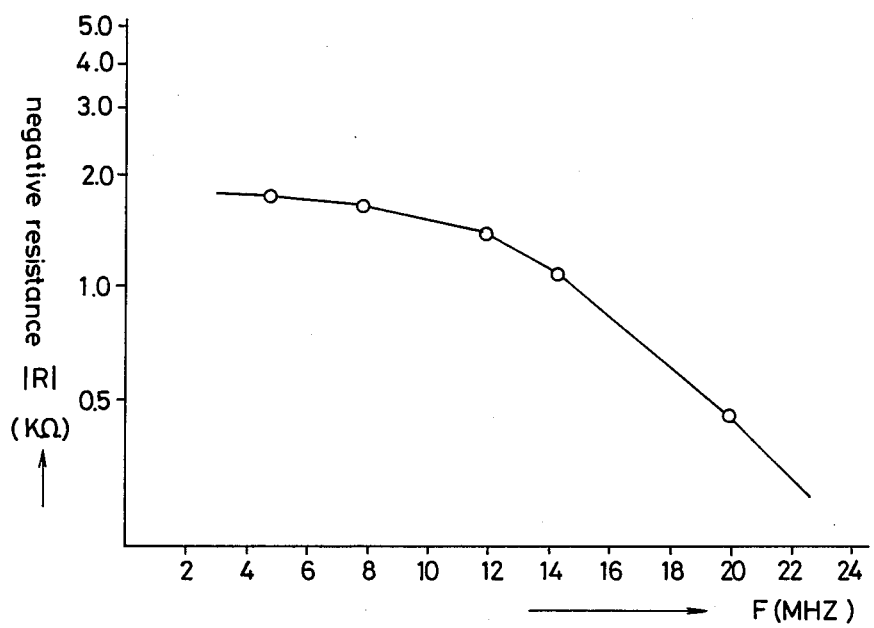
FIG. 5 is a graph showing the relationship between frequency and negative resistance of the oscillation circuit.

Referring to FIGS. 2 and 3, a disc type AT cut, thickness shear mode quartz oscillator is prepared, in which D designates diameter and T designates thickness and in this case $D=6$ mm. The outer periphery of the resonator or oscillator is trimmed just a little (see FIG. 2) to lower impedance in overtone oscillations. FIG. 4 is an oscillation circuit which is constructed without a L, C (coils, condensers) tuning circuit. The relation between the negative resistance $|R|$ of the oscillation circuit and the frequency F(MHZ) of the oscillator follows a curve as shown in FIG. 5. The shape of the curve varies a little according to the IC (integrated circuit) employed in the oscillation circuit, but each curve shows a similar declining curve.

Figure 6:
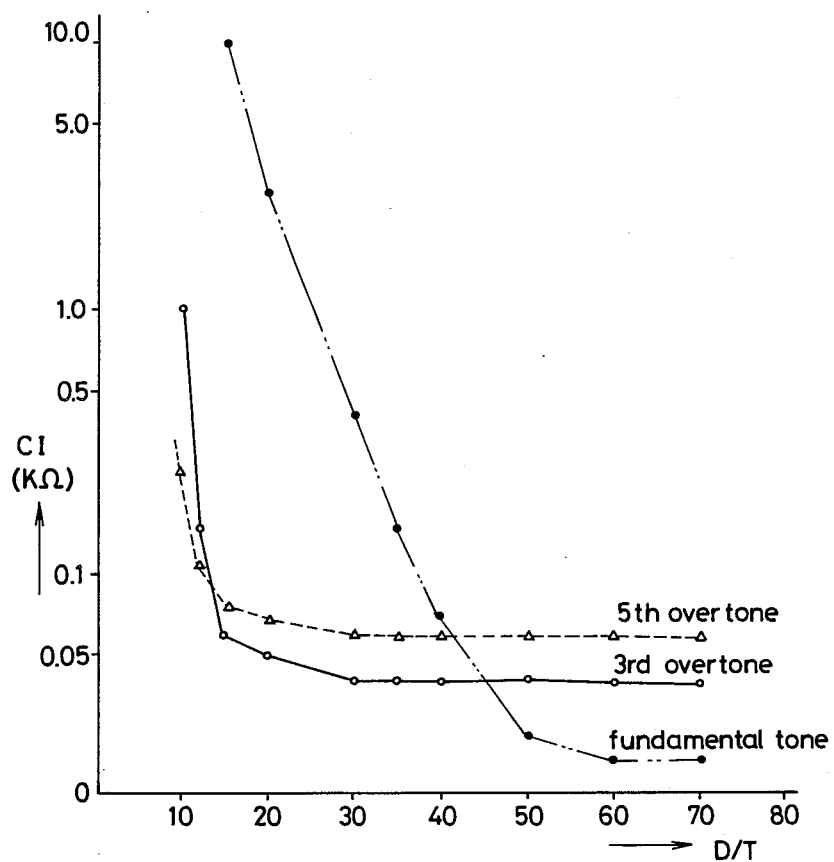
FIG. 6 is a graph showing the relationship between the proportion $D/T$ of the quartz resonator or oscillator and crystal impedance (CI) in each oscillation mode.

In the case where the diameter of the quartz oscillator is 6 mm, the relation between the proportion $D/T$ (diameter to thickness) and crystal impedance (CI) in respective oscillation modes is shown in FIG. 6. A proportional relationship exists between the thickness T of the quartz oscillator and the frequency F(MHZ) in the fundamental tone of the quartz oscillator. The relationship is provided by the following equation:

$$F(\text{MHZ}) = Kf/T \text{ (mm)}$$

(Kf=1.670, approximately).

Figure 1:
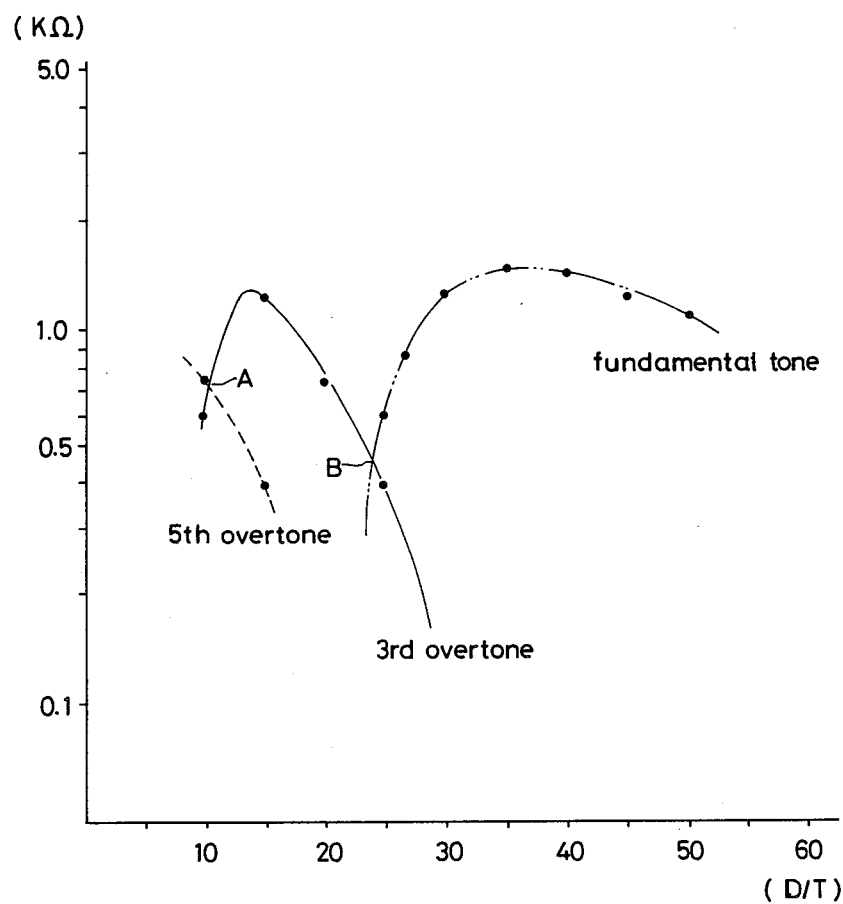
FIG. 1 is a graph showing the relationship between the proportion $D/T$ of a quartz resonator or oscillator and the difference between negative resistance of an oscillation circuit and the impedance of the quartz resonator in each oscillation mode.
Figure 7:
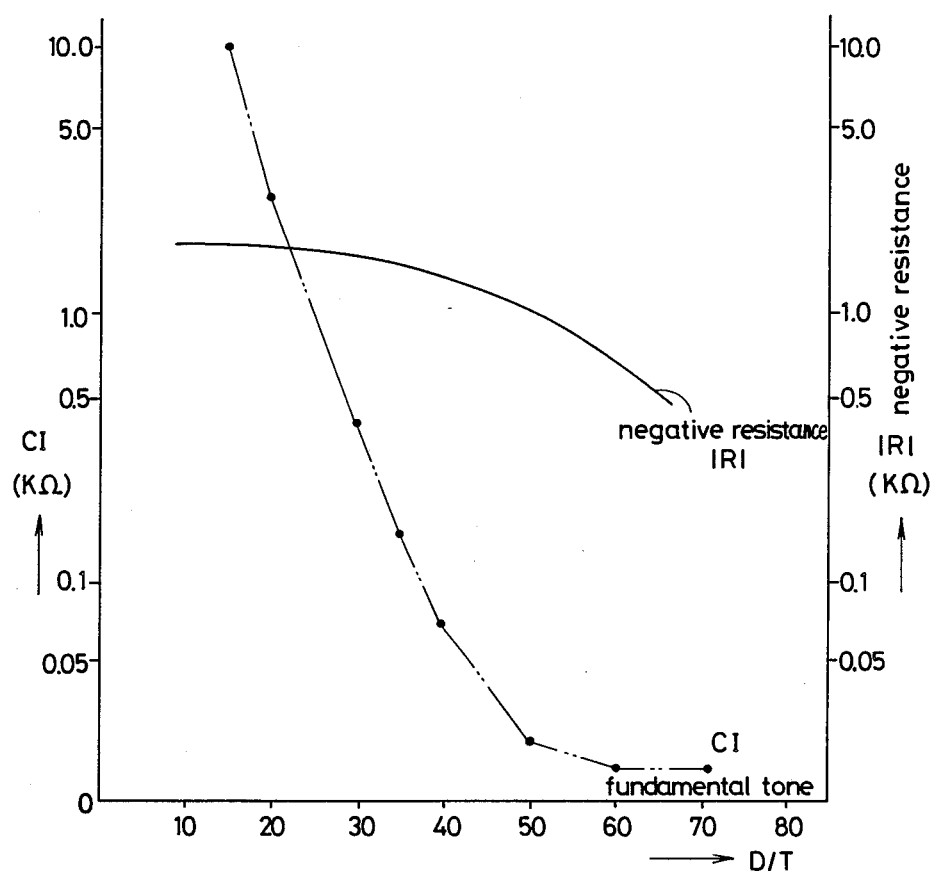
FIG. 7 is a graph showing the relationship between the proportion $D/T$ and negative resistance in fundamental tone.
Figure 8:
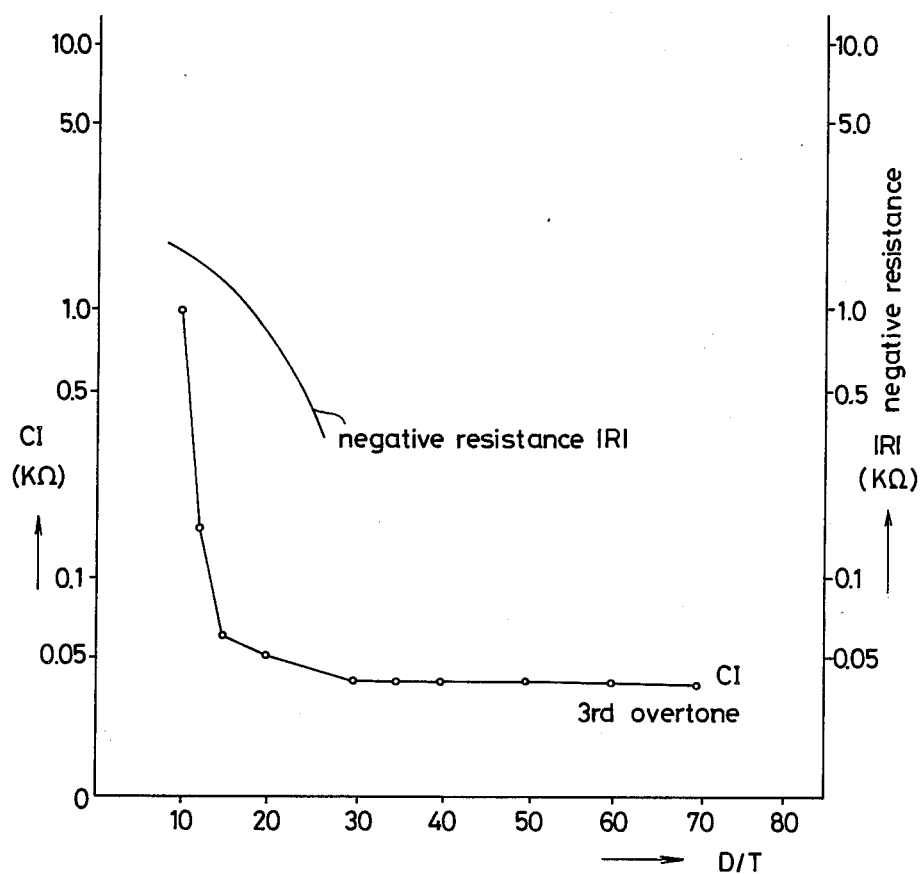
FIG. 8 is a graph showing the relationship between the proportion $D/T$ and the negative resistance in third overtone.
Figure 9:
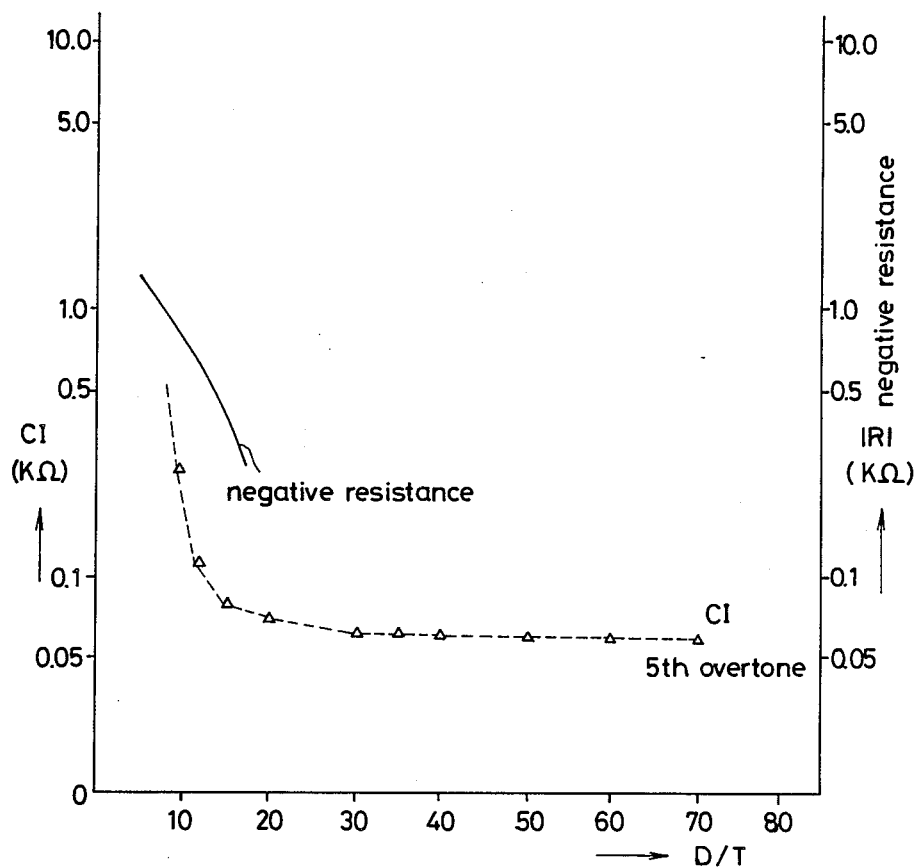
FIG. 9 is a graph showing the relationship between the proportion $D/T$ and the negative resistance in fifth overtone.

From the above equation and FIGS. 5 and 6, the relationship between the proportion $D/T$ and crystal impedance (CI) and negative resistance $|R|$ in different frequency modes are respectively shown in FIGS. 7, 8 and 9. The difference between the negative resistance $|R|$ of the circuit and the impedance (CI) of the quartz oscillator in each oscillation mode can be calculated in each of FIGS. 7, 8 or 9, and such difference is indicated graphically in FIG. 1. From FIG. 1 the difference in third overtone is greatest between point A and point B wherein the quartz oscillator oscillates in third overtone, and we can obtain an inequality, $10 < D/T < 24$. Practically speaking the third overtone oscillation is unstable near $D/T=10$ and $D/T=24$, and a stable third overtone oscillator can be obtained by determining and proportioning $D/T$ avoiding such unstable regions.

According to the present invention, the oscillation circuit can be composed of a small number of parts since it does not require a L, C (coils, condensers) tuning circuit, so the oscillation circuit can be made small. Since the quartz oscillator according to the present invention oscillates in third overtone, motional capacitance (Cm) can be made low and the influence of stray capacitance can be made small. Further, the quality factor Q can be made large, and the oscillator performs high stable oscillation with excellent aging characteristics. Furthermore, the quartz oscillator according to our present invention can be made thick as compared to the conventional quartz oscillators, and it is excellent in shock resistance.

What is claimed is:

1. An oscillator comprising a planar type thickness shear mode quartz resonator connected to a negative resistance oscillation circuit in which the proportion between the diameter and the thickness of the quartz resonator is so designed that the difference between the impedance of the quartz resonator and the negative resistance of the oscillation circuit is greater in the third overtone than in other oscillation modes.

2. The quartz resonator of claim 1 in which the proportion between the diameter and the thickness of the resonator is greater than 10 and less then 24.

3. The quartz resonator of claim 1 in which the oscillation circuit comprises a tuning circuit free of any coils and condensers.

4. The quartz resonator of claim 3 in which the resonator is driven in third overtone.

5. The quartz resonator of claim 1 in which the impedance of the resonator has been determined by trimming the outer periphery thereof at one point on the circumference.

6. In a negative resistance oscillation circuit operable in a plurality of oscillation modes: a planar type thickness shear mode AT-cut quartz resonator having a diameter and a thickness, the ratio between the diameter and the thickness of said resonator being so designed as to obtain more stable oscillation in the third overtone mode than in other oscillation modes.

7. The quartz resonator of claim 6 in which the proportion between the diameter and the thickness of the resonator is greater than 10 and less than 24.

8. The quartz resonator of claim 6 in which the oscillation circuit comprises a tuning circuit free of any coils and condensers.

9. The quartz resonator of claim 6 in which the impedance of the resonator has been determined by trimming the outer periphery thereof at one point on the circumference.

10. The quartz resonator of claim 6 in which the difference between the impedance of the resonator and the negative resistance of the oscillation circuit is greater in the third overton

* * * * *